United States Patent
Burke et al.

(10) Patent No.: US 9,224,640 B2
(45) Date of Patent: Dec. 29, 2015

(54) METHOD TO IMPROVE FINE CU LINE RELIABILITY IN AN INTEGRATED CIRCUIT DEVICE

(75) Inventors: Chad M. Burke, Barre, VT (US); Baozhen Li, South Burlington, VT (US); Keith Kwong Hon Wong, Wappingers Falls, NY (US); Chih-Chao Yang, Glenmont, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 223 days.

(21) Appl. No.: 13/587,998

(22) Filed: Aug. 17, 2012

(65) Prior Publication Data

US 2014/0048927 A1 Feb. 20, 2014

(51) Int. Cl.
*H01L 21/768* (2006.01)
*H01L 23/532* (2006.01)
*H01L 23/528* (2006.01)
*H01L 23/522* (2006.01)

(52) U.S. Cl.
CPC .... *H01L 21/76847* (2013.01); *H01L 21/76838* (2013.01); *H01L 23/5283* (2013.01); *H01L 23/53238* (2013.01); *H01L 21/76843* (2013.01); *H01L 21/76844* (2013.01); *H01L 21/76877* (2013.01); *H01L 23/528* (2013.01); *H01L 23/5226* (2013.01); *H01L 2924/0002* (2013.01)

(58) Field of Classification Search
CPC ...................................... H01L 23/48
USPC .............. 257/737, 741, 750, 751, 767, 773
See application file for complete search history.

(56) References Cited

U.S. PATENT DOCUMENTS

| 5,910,020 | A | * | 6/1999 | Yamada | 438/624 |
| 6,054,378 | A | * | 4/2000 | Skala et al. | 438/620 |
| 6,417,572 | B1 | | 7/2002 | Chidambarrao et al. | |
| 6,904,675 | B1 | * | 6/2005 | Atakov et al. | 29/852 |
| 2005/0056938 | A1 | | 3/2005 | Shimazu et al. | |
| 2008/0116582 | A1 | * | 5/2008 | Hsu et al. | 257/774 |
| 2009/0065761 | A1 | | 3/2009 | Chen et al. | |
| 2009/0294973 | A1 | | 12/2009 | Chanda et al. | |
| 2010/0099250 | A1 | | 4/2010 | Jang et al. | |
| 2010/0327445 | A1 | * | 12/2010 | Filippi et al. | 257/751 |
| 2011/0101534 | A1 | | 5/2011 | Stamper | |
| 2011/0175226 | A1 | | 7/2011 | Bonilla et al. | |

FOREIGN PATENT DOCUMENTS

CN 102214617 A 10/2011

OTHER PUBLICATIONS

Li, et al., "Reliability Challenges for Copper Interconnects," Elsevier, Microelectronics Reliability, 44, 2004, pp. 365-380.

* cited by examiner

*Primary Examiner* — William Harriston
(74) *Attorney, Agent, or Firm* — Gibb & Riley, LLC; David A. Cain, Esq.

(57) ABSTRACT

Structure and methods for forming a semiconductor structure. The semiconductor structure includes a plurality of layers comprising at least one copper interconnect layer. The copper interconnect layer provides an electrical conduit between one of physically adjacent layers in the semiconductor structure and an integrated circuit in the semiconductor structure and an electronic device. A plurality of studs is positioned within the at least one copper interconnect layer. The studs are spaced apart by a distance less than or equal to a Blech length of the at least one copper interconnect layer. The Blech length is a length below which damage due to electromigration of metal atoms within the at least one copper interconnect layer does not occur. The plurality of studs comprises copper atom diffusion barriers.

25 Claims, 13 Drawing Sheets

METHOD TO IMPROVE FINE CU LINE RELIABILITY IN AN INTEGRATED CIRCUIT DEVICE

BACKGROUND

The present disclosure relates generally to integrated circuit device fabrication, and more specifically, to a method of adding a metal stud in an integrated circuit structure to serve as a grain boundary diffusion barrier.

Integrated circuits are typically fabricated with multiple levels of patterned metallization lines, electrically separated from one another by interlayer dielectrics containing vias at selected locations to provide electrical connections between levels of the patterned metallization lines. As these integrated circuits are scaled to smaller dimensions in a continual effort to provide increased density and performance (e.g., by increasing device speed and providing greater circuit functionality within a given area chip), the interconnect linewidth dimension becomes increasingly narrow, which in turn renders them more susceptible to deleterious effects such as electromigration.

Electromigration is a term referring to the phenomenon of mass transport of metallic atoms (e.g., copper or aluminum) which make up the interconnect material, as a result of uni-directional or DC electrical current conduction therethrough. More specifically, the electron current collides with the diffusing metal atoms, thereby pushing them in the direction of electron current travel. Over an extended period of time, the depletion of metal at the cathode end creates local tensile stress to form voids in the metal to cause line resistance increase or even open circuit. On the other hand, the accumulation of metal at the anode end of the interconnect material significantly increases the local mechanical stress in the system. This in turn may lead to delamination, cracking, and even metal extrusion from the metal wire, thereby causing an electrical short to adjacent interconnects. Electromigration becomes increasingly more significant in integrated circuit design as relative current densities through metallization lines continue to increase while the linewidth dimensions shrink.

For very fine copper lines, copper grain growth, especially at the lower portion of the trench, has been a challenge. Relatively high temperature anneal was found not very effective to promote those fine grains to grow. As a result, very fine grains exist, especially along the lower portion of the trench. Those grain boundaries serve as fast copper diffusion path to cause electromigration and stress migration degradation. Both electromigration and stress migration are mechanisms that degrade the reliability of the semiconductor device and are therefore important parameters for the design of semiconductor devices. A solution is needed to block those fast copper diffusion paths in order to maintain the fine metal line reliability.

SUMMARY

According to one embodiment herein, a semiconductor structure is disclosed. The semiconductor structure comprises a plurality of layers comprising at least one copper interconnect layer. The copper interconnect layer provides an electrical conduit between one of physically adjacent layers in the semiconductor structure and an integrated circuit in the semiconductor structure and an electronic device. A plurality of studs is positioned within the at least one copper interconnect layer. The studs are spaced apart by a distance less than or equal to a Blech length of the at least one copper interconnect layer. The Blech length is a length below which damage due to electromigration of metal atoms within the at least one copper interconnect layer does not occur. The plurality of studs comprises copper atom diffusion barriers.

According to another embodiment herein, an interconnect structure for an integrated circuit device is disclosed. The interconnect structure includes a metal line formed within a dielectric layer and a plurality of metal/alloy studs positioned within the metal line. The plurality of metal/alloy studs are perpendicular to the metal line and protrude into the metal line from a bottom of the metal line. The plurality of metal/alloy studs comprises a grain boundary diffusion barrier.

According to another embodiment herein, method of forming an interconnect structure for an integrated circuit device is disclosed. The method comprises forming a multi-layer substrate having a first layer and a dielectric layer. A path is formed through the first layer and the dielectric layer. The path is filled with a metallic material. A recess is formed in the dielectric layer such that the metallic material filling the path protrudes into the recess. A metal line segment is formed within the recess in the dielectric layer.

According to another embodiment herein, a method is disclosed. The method comprises forming a first layer of a multi-layer substrate. The first layer has a plurality of metallic plugs therethrough. A dielectric layer is deposited on the first layer. A recess is formed through the dielectric layer and at least partially through the first layer such that the plurality of metallic plugs protrudes into the recess. A metal line segment is formed within the recess. The metallic plugs are perpendicular to the metal line.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
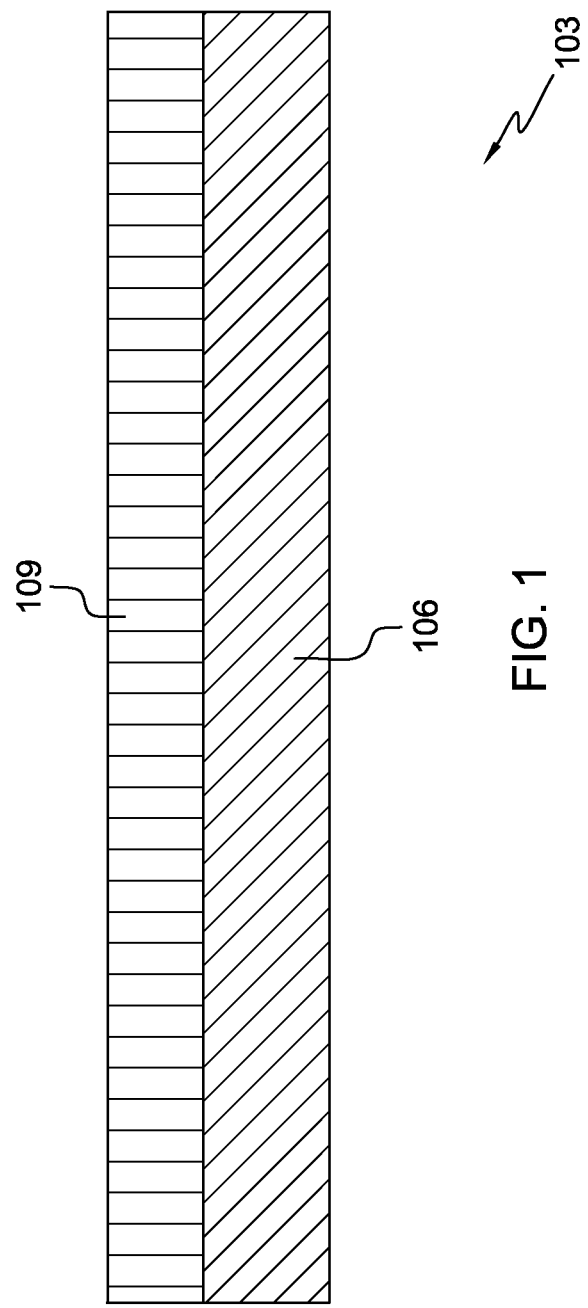
FIG. 1 is a schematic diagram of a sectional view of a semiconductor structure illustrating embodiments herein.

As mentioned above, for very fine copper interconnect lines, copper grain growth, especially at the lower portion of the trench, has been a challenge. Very fine copper grains exist, especially along the lower portion of the trench. The grain boundaries serve as fast copper diffusion paths to cause electromigration (EM) and stress migration (SM) degradation. To improve EM/SM performance, common solutions have been doped alloy seed (e.g. CuMn and CuAl) or a metal cap (e.g. a thin layer of CoWP on the copper surface). The net result of the doped alloy seed or metal cap is to slow down the copper diffusion along the top surface significantly. The effectiveness of those solutions relies on the copper grain structures; that is, in order to reduce EM degradation, "blocking" grains (bamboo like) are needed along the metal interconnect line. The lack of bamboo grains in the fine lines makes the copper/cap interface engineering (e.g. CoWP or CuMn/CuAl dope seed) not effective to enhance electromigration performances for such fine interconnect lines. The systems and methods herein address these issues by enhancing electromigration performance using metallic (e.g. tungsten) studs as copper grain boundary diffusion blockers.

Typically, the metal 1 (M1) layer of a semiconductor substrate is the most critical copper layer for electromigration challenges. This is because the M1 layer includes the most commonly used fine lines to connect devices. According to embodiments herein, in order to enhance very fine copper line EM performance one or more metal (e.g. tungsten (W)) studs are used as copper grain boundary diffusion blockers. In some embodiments, the stud protrudes only partially into the M1 line, for example only half of the trench height. In some embodiments, the stud protrudes fully into the M1 line. The spacing between the one or more studs is selected such that the length between any two studs is less than the Blech length for the interconnect material. In some embodiments, the stud can be an active part (i.e. serving to connect other interconnects or devices) of an integrated circuit on the substrate. In some embodiments, the stud may be inactive (dummy), simply landing on a dielectric layer.

Referring now to the drawings, there are shown exemplary illustrations of the method and structures of a semiconductor wafer according to embodiments herein.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

FIG. 1 illustrates a schematic diagram of a cross-sectional view of a multi-layer substrate 103 according to one exemplary embodiment herein. The substrate 103 includes a first layer 106 and a dielectric or insulator layer 109. In some embodiments, the first layer 106 may be an oxide layer.

For purposes herein, an "insulator" is a relative term that means a material or structure that allows substantially less (<95%) electrical current to flow than does a "conductor." The dielectrics (insulators) mentioned herein can, for example, be formed by plasma deposition of $SiO_2$ or $SiO_2$ based materials by reacting either tetra-ethyl-ortho-silane (TEOS) or silane with O2 or activated O2, i.e. O3 or O—. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

Figure 2:
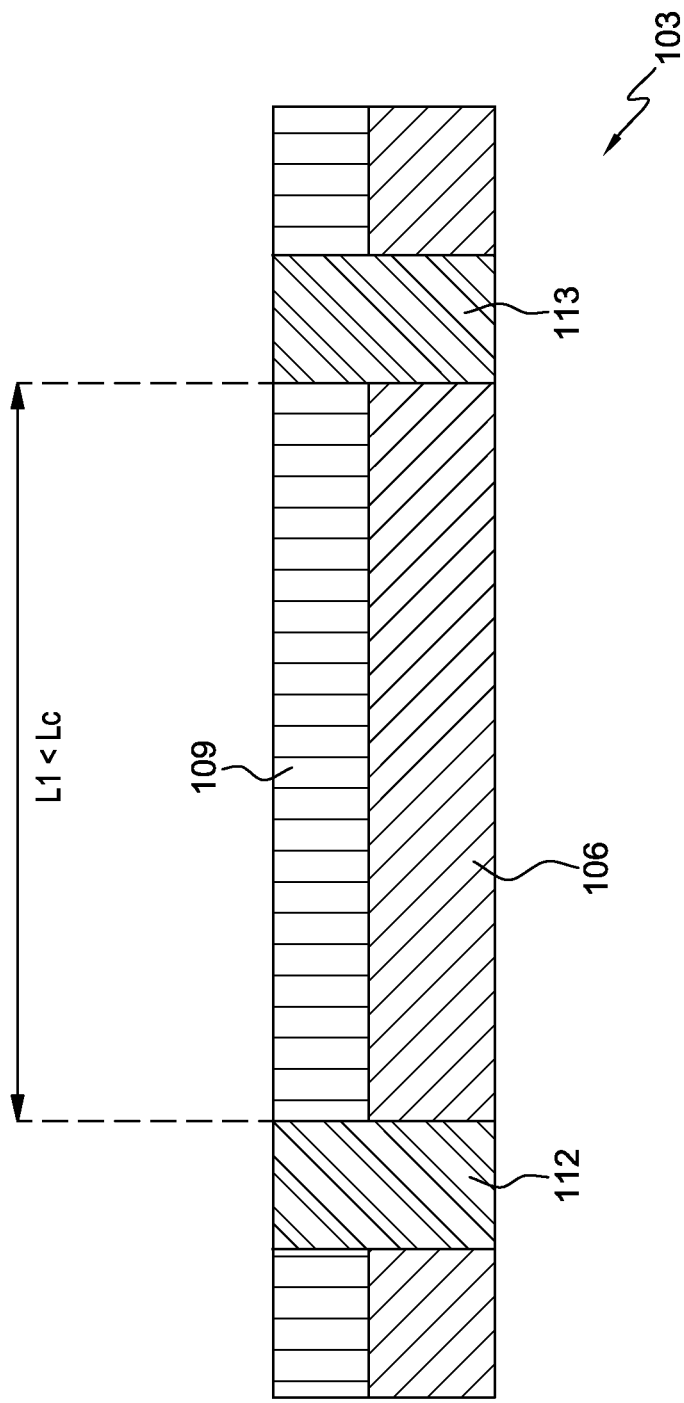
FIG. 2 is a schematic diagram of a sectional view of a semiconductor structure illustrating embodiments herein.

In FIG. 2, contact plugs 112, 113 are formed through the first layer 106 and the dielectric layer 109. The contact plugs 112, 113 may be formed by patterning the first layer 106 and the dielectric layer 109, such as by creating a via, and filling the patterned area with metallic material. The metallic material may be any appropriate conductor, such as copper (Cu) or tungsten (W). In some embodiments, the metallic material may be selected from copper, aluminum, tantalum, tantalum nitride, titanium, titanium nitride, tungsten, ruthenium, manganese, cobalt, and combinations thereof.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, nickel, aluminum, or copper, or a metal silicide, any alloys of such metals, and may be deposited using physical vapor deposition, chemical vapor deposition, or any other technique known in the art.

While only two layers of the multi-layer substrate 103 are shown in the illustrated examples, it is contemplated that several layers may exist in the semiconductor. Further, while the examples described herein are particularly applicable to the M1 layer, the concepts described herein can be similarly extended to any copper levels (Mx) with a single damascene process.

Further, it is contemplated that the contact plugs 112, 113 may provide an electrical transmission path for an integrated circuit embedded in the semiconductor substrate. Alternatively, the contact plugs 112, 113 may be inactive by merely resting on a dielectric layer.

Figure 3:
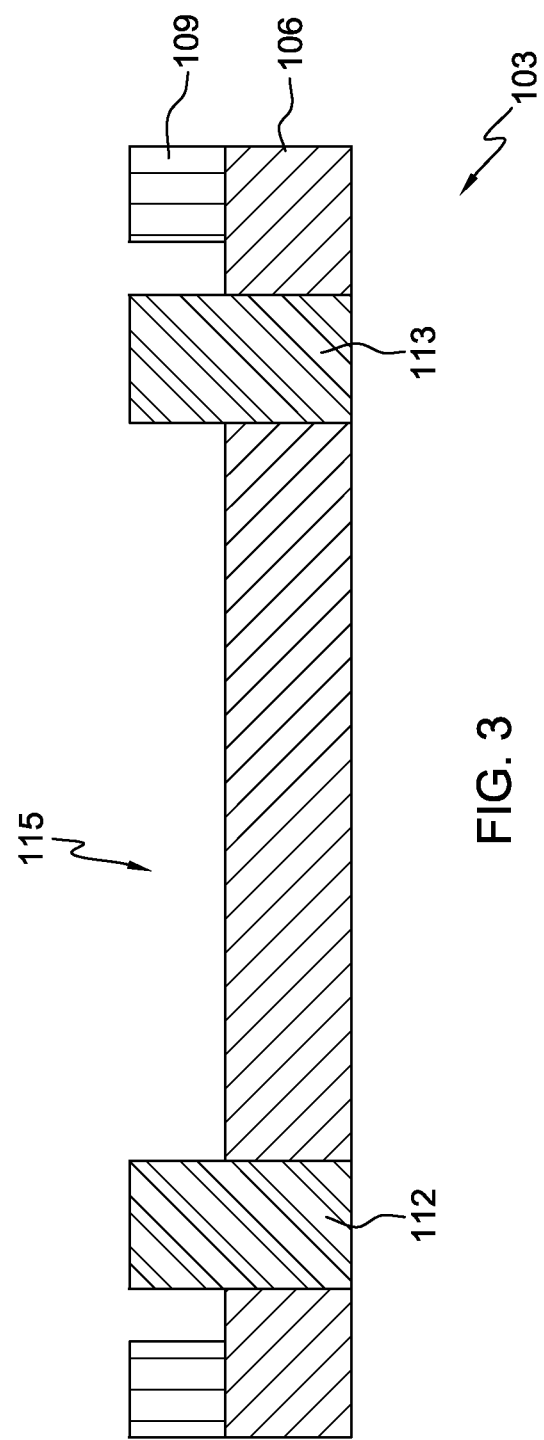
FIG. 3 is a schematic diagram of a sectional view of a semiconductor structure illustrating embodiments herein.

In FIG. 3, the dielectric layer 109 is patterned using a commonly used damascene process to form a recess 115 in the dielectric layer 109.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

Alternatively, the recess 115 may be formed by applying a hardmask and etching the dielectric layer 109. A hardmask can be formed of any suitable material, whether now known or developed in the future, such as a metal or organic hardmask, which has a hardness greater than the substrate and insulator materials used in the remainder of the structure.

Figure 4:
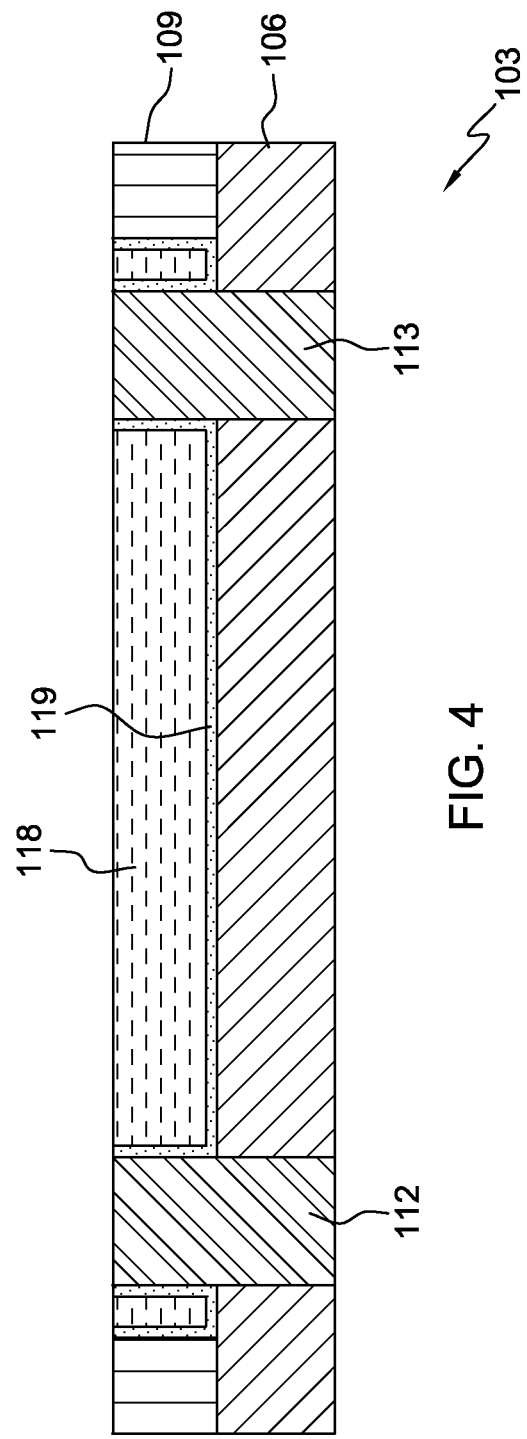
FIG. 4 is a schematic diagram of a sectional view of a semiconductor structure illustrating embodiments herein.

FIG. 4 shows a metal line 118 formed within the recess 115. According to embodiments herein, the metal line 118 comprises a metallic liner 119 (e.g. tantalum (Ta) or tantalum nitride (TaN)) and copper. The contact plugs 112, 113 protrude into the metal line 118, from the bottom up, to serve as grain boundary diffusion barriers for copper atom migration. In some embodiments, the contact plugs 112, 113 protrude only partially into the metal line 118, for example only half of the thickness of the metal line 118, other distances may be used. In some embodiments, the contact plugs 112, 113 protrude fully through the metal line 118. According to embodiments herein, the contact plugs 112, 113 should protrude into the metal line 118 a sufficient depth so as to act as a diffusion blocker.

As shown in FIG. 2, the distance between contact plug 112 and contact plug 113 is indicated as L1. There exists a certain length of conductor, known as the Blech length below which electromigration damage does not occur because the material transporting forces due to the electrical current are at least partially compensated by a developing mechanical stress. The Blech length, indicated as Lc, is dependent upon the current density as well as on the geometry of the conductors.

According to embodiments herein, if the metal line 118 is in an interconnect layer, that is a layer providing an electrical conduit between neighboring layers in the multi-layer substrate 103 or between an integrated circuit embedded in the semiconductor and an electronic device, then the spacing between the contact plugs 112, 113 should be less than the Blech length (Lc). By spacing the contact plugs 112, 113 at L1≤Lc, the metal line 118 can become immortal for electromigration. If the contact plugs 112, 113 are located at L1>Lc, the metal line 118 electromigration performance can still be enhanced by suppressing long range copper diffusion in the metal line 118.

While the contact plugs 112, 113 improve EM performance of the substrate 103, these barriers can improve the SM performance, as well, by blocking the copper vacancy diffusion along the grain boundaries.

According to embodiments herein, the diameter for contact plugs 112, 113 is approximately 0.02-0.03 μm (this is only one example, the method should work with other contact dimensions as well), using advanced technologies. Accordingly, the contact plugs 112, 113 may replace <3% of the copper volume in the metal line. However, for wider metal lines, larger metallic bars can serve as copper diffusion blocking islands. Additionally, typical copper alloying can cause line resistance to increase from approximately 5-10%; however, using a metallic protrusion, as described herein, the increase in resistance is expected to be less than approximately 3%.

Figure 5:
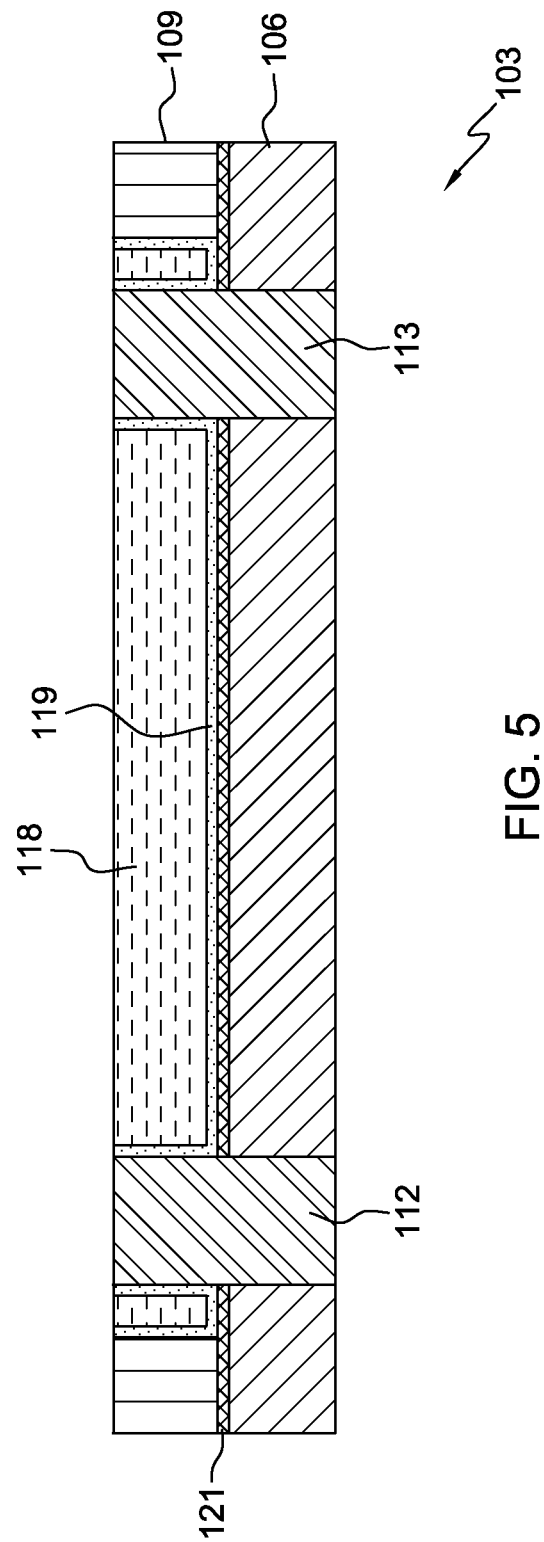
FIG. 5 is a schematic diagram of a sectional view of a semiconductor structure illustrating embodiments herein.

FIG. 5 illustrates another embodiment in which an etching stop layer 121 is provided between the first layer 106 and the dielectric layer 109. Note the etching stop layer 121 can be optional, and need not be included between the first layer 106 and the dielectric layer 109.

Figure 6:
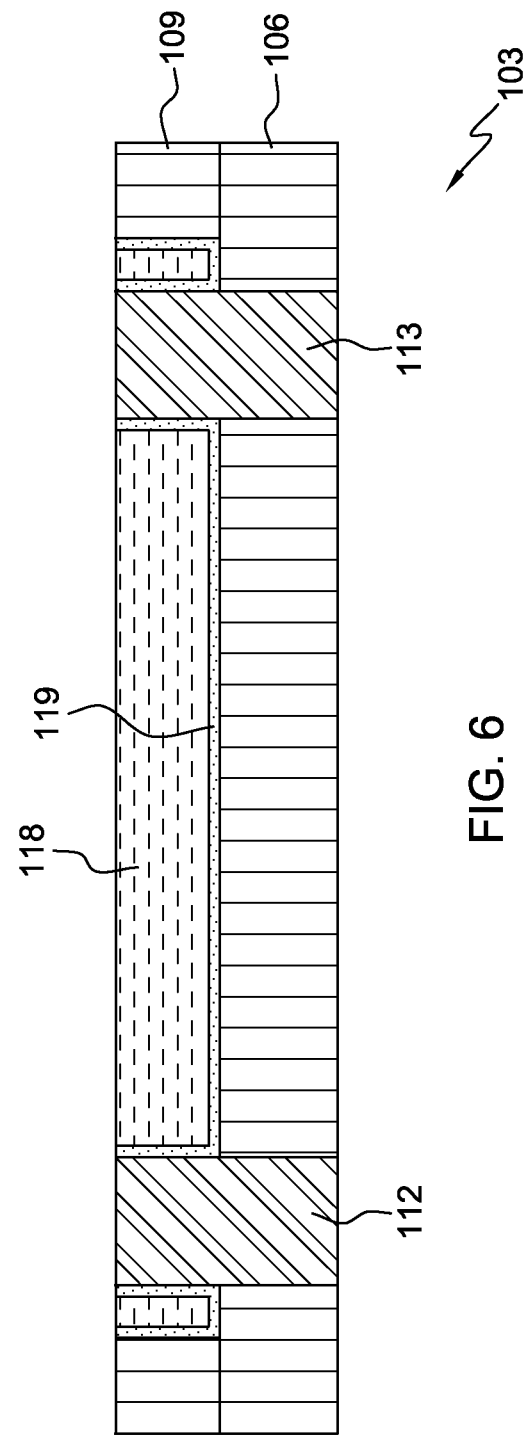
FIG. 6 is a schematic diagram of a sectional view of a semiconductor structure illustrating embodiments herein.

FIG. 6 illustrates another embodiment in which the first layer 106 comprises the same dielectric material as the dielectric layer 109.

Figure 7:
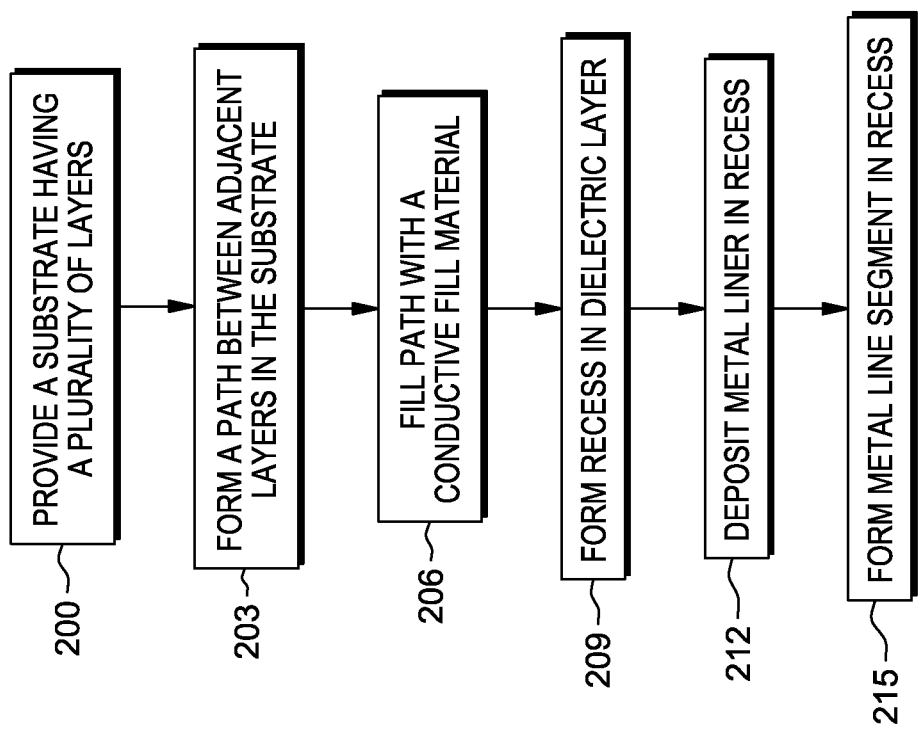
FIG. 7 is a flow diagram illustrating embodiments herein.

Referring to FIG. 7, a method of forming an interconnect structure for an integrated circuit device is illustrated. First, at 200, a multi-layer substrate is provided. The substrate has at least a first layer and a dielectric layer. At 203, a path is formed between adjacent layers in the substrate; that is, through the first layer and the dielectric layer. The path is filled with a metallic material, at 206. In some embodiments, the metallic material is tungsten (W) or copper (Cu). Other appropriate materials may be used. A recess is formed in the dielectric layer, at 209. The recess is formed such that the metallic material filling the path protrudes into the recess. In some embodiments, the metallic material protrudes only partially into the recess. In some embodiments, the metallic material protrudes all the way through the recess. At 212, a metal liner is deposited in the recess. At 215, a metal line segment is formed on the metal liner within the recess in the dielectric layer.

Figure 8:
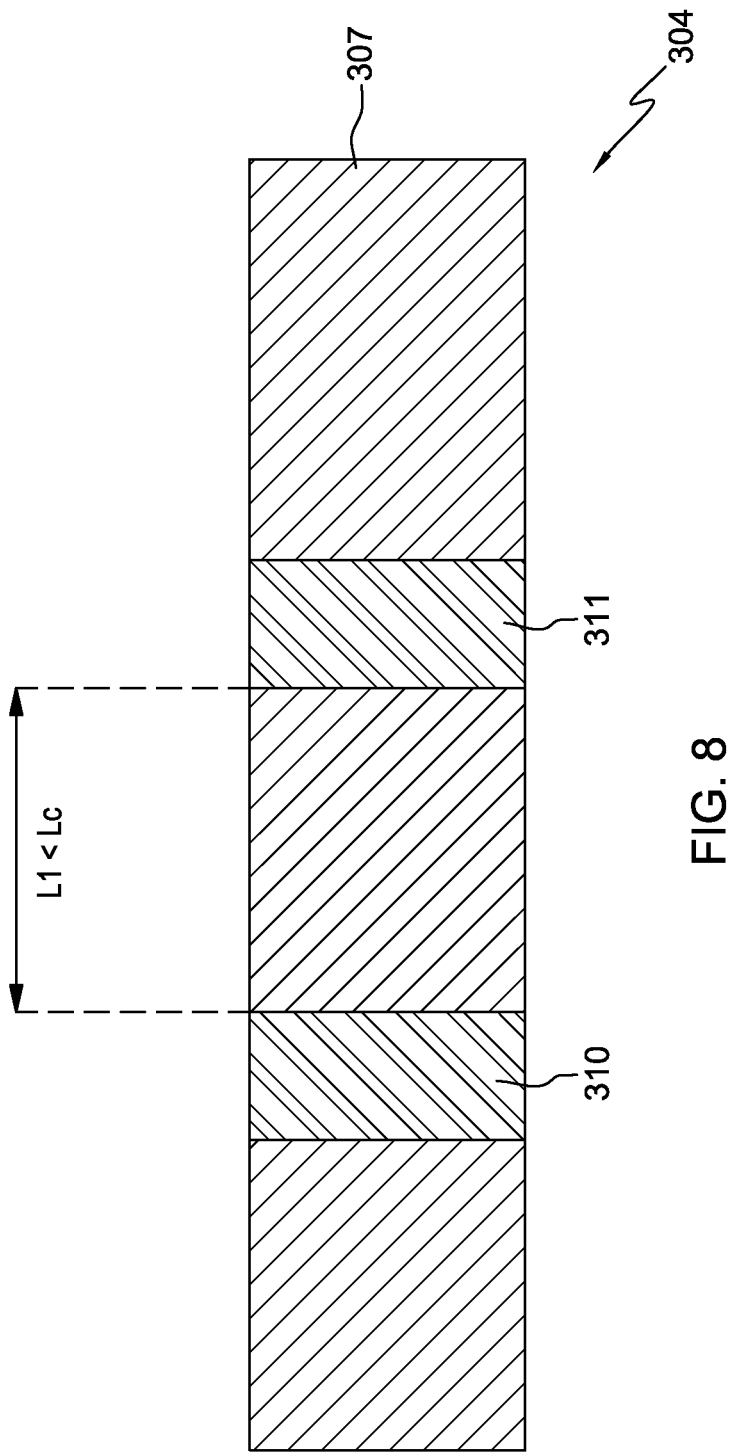
FIG. 8 is a schematic diagram of a sectional view of a semiconductor structure illustrating embodiments herein.

FIG. 8 illustrates a schematic diagram of a cross-sectional view of a semiconductor substrate 304 according to another exemplary embodiment herein. The substrate 304 includes a first layer 307 having contact plugs 310, 311 therethrough. In some embodiments, the first layer 307 may be an oxide layer.

Figure 9:
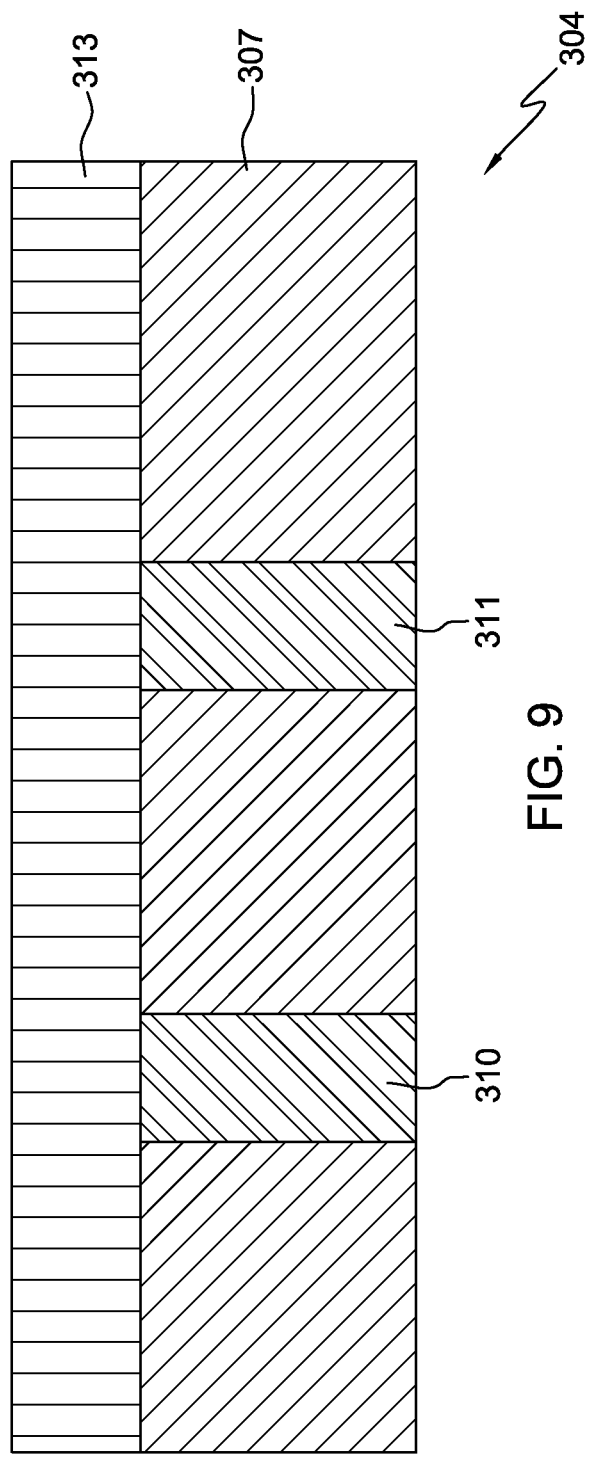
FIG. 9 is a schematic diagram of a sectional view of a semiconductor structure illustrating embodiments herein.
Figure 10:
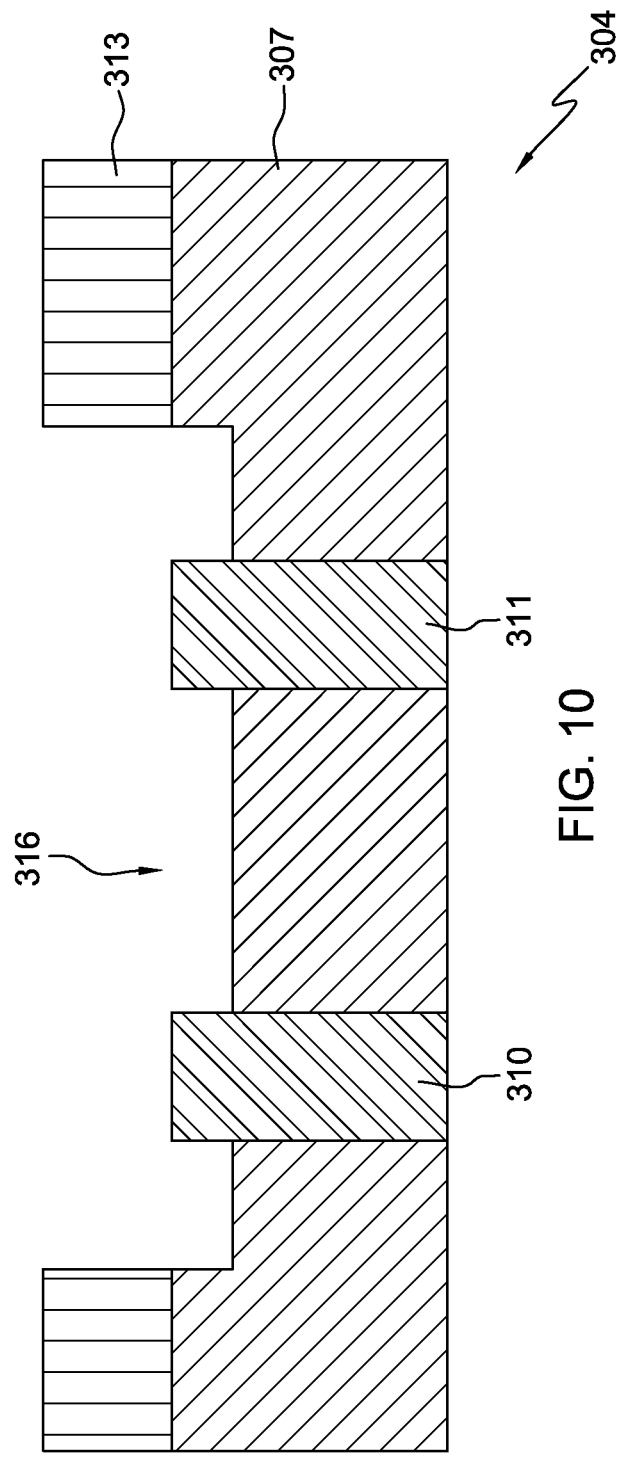
FIG. 10 is a schematic diagram of a sectional view of a semiconductor structure illustrating embodiments herein.

In FIG. 9, a dielectric layer 313 is deposited on the first layer 307. The dielectric layer 313 can, for example, be formed by plasma deposition of SiO2 or SiO2 based materials by reacting either tetra-ethyl-ortho-silane (TEOS) or silane with O2 or activated O2, i.e. O3 or O—. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectric layer 313 may vary contingent upon the required device performance In FIG. 10, a recess 316 is formed through the dielectric layer 313 and at least partially into the first layer 307. The recess 316 may be formed by etching or patterning using a process as is known in the art.

Figure 11:
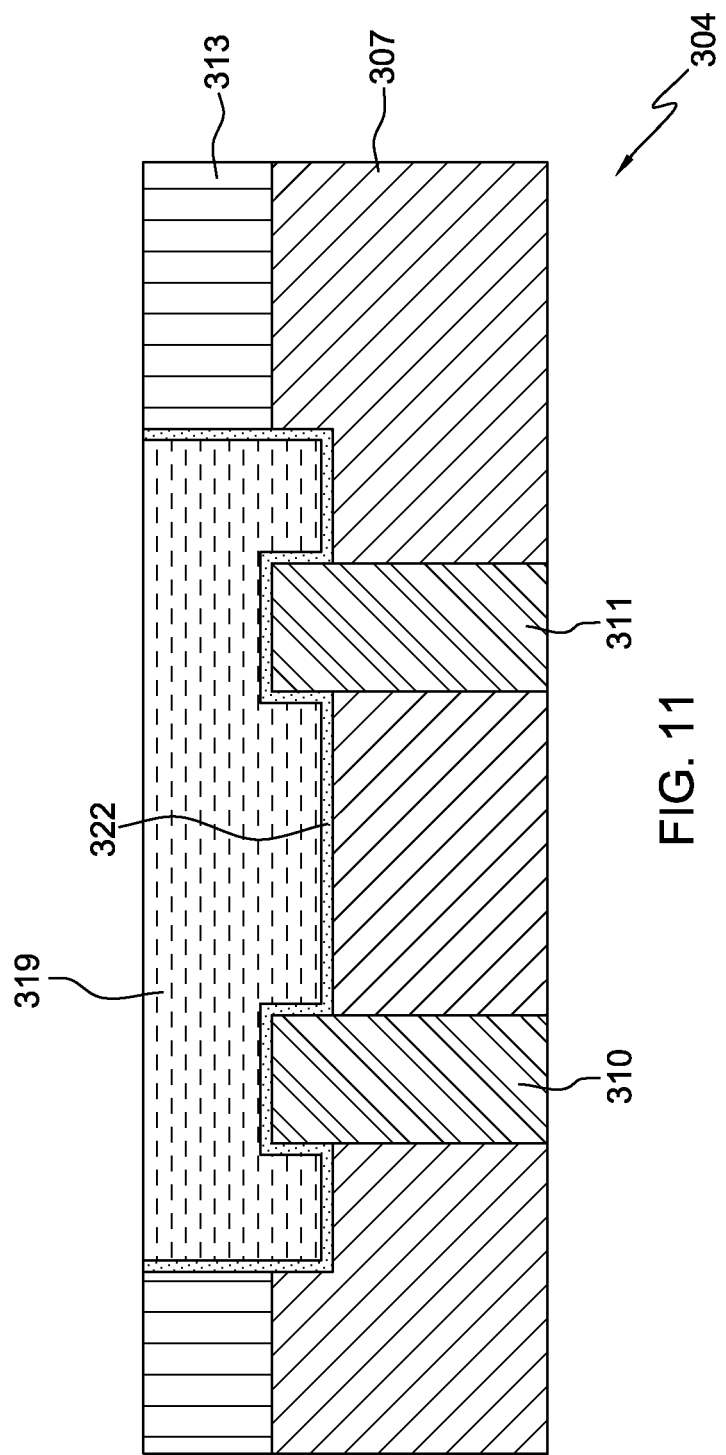
FIG. 11 is a schematic diagram of a sectional view of a semiconductor structure illustrating embodiments herein.

FIG. 11 shows a metal line 319 formed within the recess 316. According to embodiments herein, the metal line 319 comprises a metallic liner 322 (e.g. tantalum (Ta) or tantalum nitride (TaN)) and copper. The contact plugs 310, 311 protrude into the metal line 319, from the bottom up, to serve as grain boundary diffusion barriers for copper atom migration. In some embodiments, the contact plugs 310, 311 protrude only partially into the metal line 319, for example only half of the thickness of the metal line 319, other distances may be used. In some embodiments, the contact plugs 310, 311 protrude fully through the metal line 319. According to embodiments herein, the contact plugs 310, 311 should protrude into the metal line 319 a sufficient depth so as to act as a diffusion blocker.

As shown in FIG. 8, the distance between contact plug 310 and contact plug 311 is indicated as L1. As described above, there exists a certain length of conductor, known as the Blech length below which electromigration damage does not occur because the material transporting forces due to the electrical current are at least partially compensated by a developing mechanical stress. The Blech length, indicated as Lc, is dependent upon the current density as well as on the geometry of the conductors.

According to embodiments herein, if the metal line 319 is in an interconnect layer, that is a layer providing an electrical conduit between neighboring layers in the semiconductor substrate 304 or between an integrated circuit embedded in the semiconductor and an electronic device, then the spacing between the contact plugs 310, 311 should be less than the Blech length (Lc). By spacing the contact plugs 310, 311 at L1< or =Lc, the metal line 319 can become immortal for electromigration. If the contact plugs 310, 311 are located at L1>Lc, the metal line 319 electromigration performance can still be enhanced by suppressing long range copper diffusion in the metal line 319.

Figure 12:
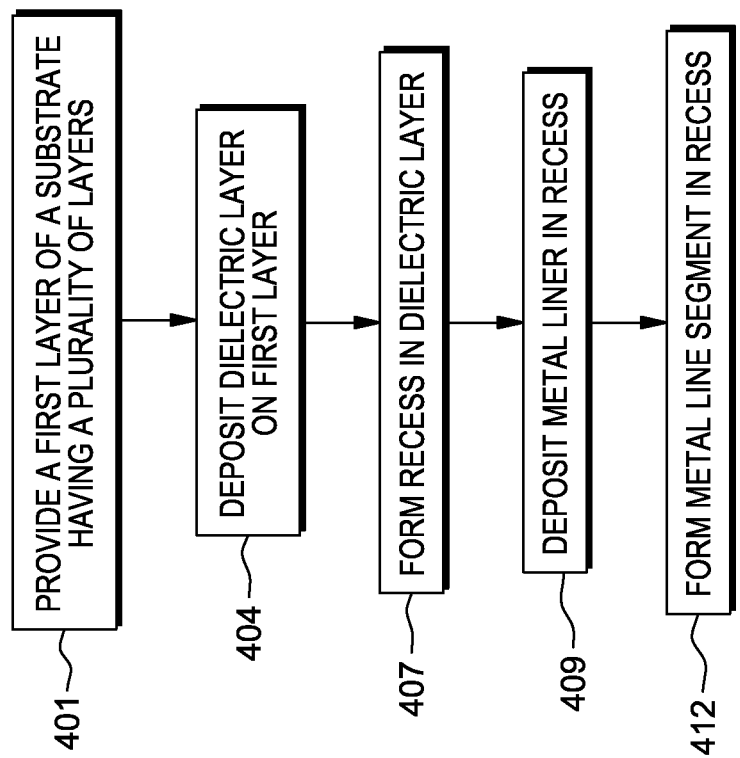
FIG. 12 is a flow diagram illustrating embodiments herein.

Referring to FIG. 12, a method is shown. At 401, a first layer of a multi-layer substrate is formed. The first layer has a plurality of vertical metallic plugs that pass through the first layer. At 404, a dielectric layer is deposited on the first layer. A recess is formed through the dielectric layer and at least partially into the first layer, at 407. The recess is formed such that the vertical metallic plugs protrude at least partially into the recess in the dielectric layer. In some embodiments, the metallic plugs protrude only partially into the recess. In some embodiments, the metallic plugs protrude all the way through the recess. At 409, a metal liner is deposited in the recess. At 412, a metal line segment is formed within the recess.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Aspects of the present disclosure are described herein with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 13:
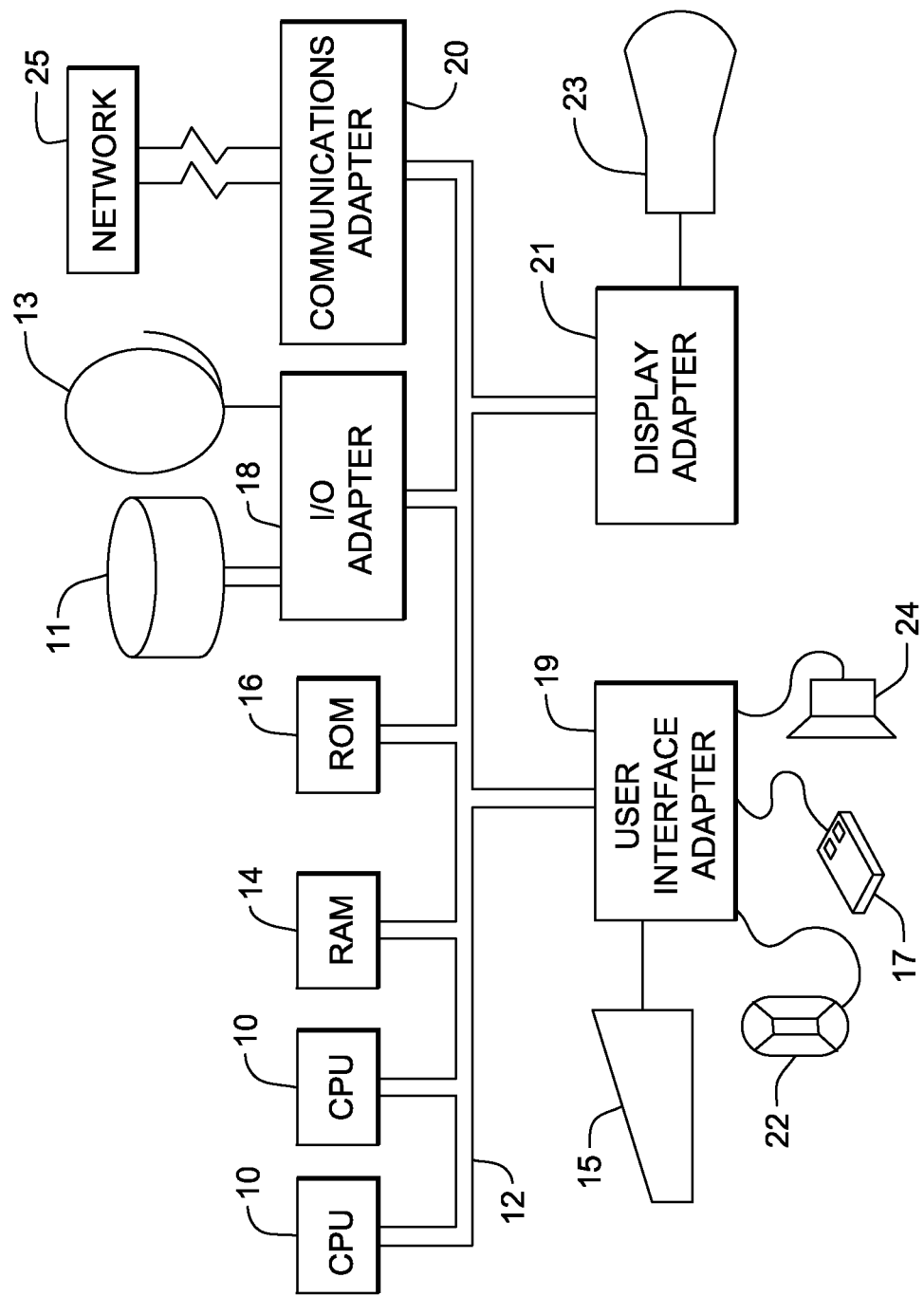
FIG. 13 is a schematic diagram of a hardware system according to embodiments herein.

A representative hardware environment for practicing the embodiments herein is depicted in FIG. 13. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein.

In FIG. 13, CPUs 10 perform various processing based on a program stored in a Read Only Memory (ROM) 16 or a program loaded from a peripheral device, such as disk units 11 and tape drives 13 to a Random Access Memory (RAM) 14. In the RAM 14, required data when the CPU 10 performs the various processing or the like is also stored as necessary. The CPU 10, the ROM 16, and the RAM 14 are connected to one another via a bus 12. An input/output adapter 18 is also connected to the bus 12 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 14, as necessary.

The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 including a network interface card such as a LAN card, a modem, or the like connects the bus 12 to a data processing network 25. The communication adapter 20 performs communication processing via a network such as the Internet. A display adapter 21 connects the bus 12 to a display device 23, which may be embodied as an output device such as a monitor (such as a Cathode Ray Tube (CRT), a Liquid Crystal Display (LCD), or the like), printer, or transmitter, for example.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a plurality of layers comprising at least a first layer and a dielectric layer above said first layer;
at least one copper interconnect layer within a recess in said dielectric layer such that top surfaces of said dielectric layer and said at least one copper interconnect layer are essentially co-planar, said copper interconnect layer providing an electrical conduit between at least one of:
physically adjacent layers in said semiconductor structure, and
an integrated circuit in said semiconductor structure and an electronic device; and
a plurality of studs extending vertically through said first layer and further protruding into said at least one copper interconnect layer from a bottom of said at least one copper interconnect layer,
each of said studs having lower opposing sidewalls adjacent to said first layer and upper opposing sidewalls adjacent to said at least one copper interconnect layer,
adjacent studs being spaced apart by a distance less than or equal to a Blech length of said at least one copper interconnect layer,
said Blech length comprising a length below which damage due to electromigration of metal atoms within said at least one copper interconnect layer does not occur, and
said plurality of studs comprising copper atom diffusion barriers based on spacing between said plurality of studs.

2. The structure of claim 1, said at least one copper interconnect layer comprising a copper metal line.

3. The structure of claim 1, said plurality of studs comprising any of copper (Cu), tantalum (Ta), tantalum nitride (TaN), titanium (Ti), titanium nitride (TiN), tungsten (W), ruthenium (Ru), manganese (Mn), cobalt (Co), aluminum (Al) and combinations thereof.

4. The structure of claim 1, said plurality of studs further extending vertically completely through said at least one copper interconnect layer and said structure further comprising a metallic liner lining said recess and said upper opposing sidewalls of each of said studs.

5. The structure of claim 1,
said plurality of studs protruding only partially into said at least one copper interconnect layer such that said studs are below a level of said top surfaces of said dielectric layer and said at least one copper interconnect layer, and
said structure further comprising a metallic liner lining said recess and said upper opposing sidewalls and a top surface of each of said studs.

6. The structure of claim 1, at least one of said plurality of studs being formed in a contact location of a semiconductor device formed in a substrate underneath said at least one copper interconnect layer.

7. An interconnect structure for an integrated circuit device, said structure comprising:
an oxide layer;
a dielectric layer above said oxide layer;
a metal line within a recess in said dielectric layer such that top surfaces of said dielectric layer and said metal line are essentially co-planar; and
a plurality of metal/alloy studs extending vertically through said oxide layer, being perpendicular to said metal line and protruding into said metal line from a bottom of said metal line,
each of said metal/alloy studs having lower opposing sidewalls adjacent to said oxide layer and upper opposing sidewalls adjacent to said metal line,
adjacent metal/alloy studs being spaced apart by a distance less than or equal to a Blech length for said metal line, and
said plurality of metal/alloy studs comprising a grain boundary diffusion barrier for metal atoms in said metal line based on spacing between said plurality of metal/alloy studs.

8. The interconnect structure of claim 7, said metal line comprising copper (Cu).

9. The interconnect structure of claim 7, said plurality of metal/alloy studs comprising one of copper (Cu), tantalum (Ta), tantalum nitride (TaN), titanium (Ti), titanium nitride (TiN), tungsten (W), ruthenium (Ru), manganese (Mn), cobalt (Co), aluminum (Al) and combinations thereof.

10. The interconnect structure of claim 7, said metal line being in a metal 1 (M1) layer.

11. The interconnect structure of claim 7,
said plurality of metal/alloy studs protruding only partially into said metal line such that said metal/alloy studs are below a level of said top surfaces of said dielectric layer and said metal line, and
said interconnect structure further comprising a metallic liner lining said recess and said upper opposing sidewalls and a top surface of each of said metal/alloy studs.

12. The interconnect structure of claim 7, said plurality of metal/alloy studs extending vertically completely through said metal line and said interconnect structure further comprising a metallic liner lining said recess and said upper opposing sidewalls of each of said metal/alloy studs.

13. The interconnect structure of claim 7, at least one of said plurality of metal/alloy studs being formed in a contact location of a semiconductor device formed in a substrate underneath said dielectric layer.

14. A method of forming an interconnect structure for an integrated circuit device, the method comprising:
forming a multi-layer substrate having a first layer and a dielectric layer;
forming paths that extend vertically through said first layer and said dielectric layer;
filling said paths with a metallic material to create a plurality of studs that extend vertically through said first layer and said dielectric layer;
forming a recess in said dielectric layer such that an upper portion of each of said studs protrudes into said recess; and
forming a metal line segment within said recess in said dielectric layer such that top surfaces of said dielectric layer, said metal line segment and each of said studs are essentially co-planar and such that each of said studs has lower opposing sidewalls adjacent to said first layer and upper opposing sidewalls adjacent to said metal line segment,
said paths being formed and filled with said metallic material such that adjacent studs are spaced apart by a distance less than or equal to a Blech length of said metal line segment and such that said studs comprise a grain boundary diffusion barriers for metal atoms in said metal line segment.

15. The method of claim 14, said metal line segment comprising copper (Cu).

16. The method of claim 14, said metallic material comprising one of copper (Cu), tantalum (Ta), tantalum nitride (TaN), titanium (Ti), titanium nitride (TiN), tungsten (W), ruthenium (Ru), manganese (Mn), cobalt (Co), aluminum (Al) and combinations thereof.

17. The method of claim 14, further comprising, before said forming of said metal line segment, lining said recess and said upper opposing sidewalls of each of said studs with a metallic liner.

18. The method of claim 14, said forming of said paths further comprising:
forming at least one path in a contact location of a semiconductor device formed in a substrate underneath one of said first layer and said dielectric layer.

19. The method of claim 17, said metallic liner comprising any of tantalum and tantalum nitride.

20. A method comprising:
forming a first layer of a multi-layer substrate, said first layer having a plurality of metallic plugs therethrough;
depositing a dielectric layer on said first layer and on said metallic plugs;
forming a recess through said dielectric layer and partially through said first layer such that said plurality of metallic plugs protrudes into said recess; and
forming a metal line segment within said recess such that top surfaces of said dielectric layer and said metal line segment are essentially co-planar, such that said metallic plugs are below a level of said top surfaces of said dielectric layer and said metal line segment, and such that each of said metallic plugs has lower opposing sidewalls adjacent to said first layer and upper opposing sidewalls and a top surface adjacent to said metal line segment,
said metallic plugs being formed such that said metallic plugs are perpendicular to said metal line segment, such that adjacent metallic plugs are spaced apart by a distance less than or equal to a Blech length of said metal line segment and such that said metallic plugs comprise a grain boundary diffusion barrier for metal atoms in said metal line segment.

21. The method of claim 20, said metal line segment comprising copper (Cu).

22. The method of claim 20, said plurality of metallic plugs comprising one of copper (Cu), tantalum (Ta), tantalum nitride (TaN), titanium (Ti), titanium nitride (TiN), tungsten (W), ruthenium (Ru), manganese (Mn), cobalt (Co), aluminum (Al) and combinations thereof.

23. The method of claim 20, further comprising, before said forming of said metal line segment, lining said recess and said upper opposing sidewalls and said top surface of each of said metallic plugs with a metallic liner.

24. The method of claim 20, said forming of said first layer further comprising:
forming at least one of said plurality of metallic plugs in a contact location of a semiconductor device formed in a substrate underneath one of said first layer and said dielectric layer.

25. The method of claim 23, said metallic liner comprising any of tantalum and tantalum nitride.

\* \* \* \* \*